(12) United States Patent
Ye et al.

(10) Patent No.: US 6,191,606 B1
(45) Date of Patent: *Feb. 20, 2001

(54) METHOD AND APPARATUS FOR REDUCING STANDBY LEAKAGE CURRENT USING INPUT VECTOR ACTIVATION

(75) Inventors: Yibin Ye, Portland; Vivek K. De, Beaverton, both of OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/150,869

(22) Filed: Sep. 10, 1998

(51) Int. Cl.$^7$ .................................... H03K 17/16

(52) U.S. Cl. .............. 326/31; 326/102; 326/83; 326/34

(58) Field of Search .......................... 326/31, 34, 56–58, 326/83, 86, 87, 101–102; 327/384, 544

(56) References Cited

U.S. PATENT DOCUMENTS

| | | |
|---|---|---|
| 4,894,558 | 1/1990 | Conkle et al. . |
| 5,107,230 * | 4/1992 | King ........................... 326/86 |
| 5,216,289 * | 6/1993 | Hahn et al. .................... 326/86 |
| 5,491,429 | 2/1996 | Gasparik . |
| 5,537,060 * | 7/1996 | Baek ............................ 326/58 |
| 5,614,847 | 3/1997 | Kawahara et al. . |
| 5,617,043 * | 4/1997 | Han et al. ..................... 326/83 |
| 5,751,651 | 5/1998 | Ooishi . |
| 5,773,999 * | 6/1998 | Park et al. .................... 326/87 |
| 5,852,579 * | 12/1998 | Arcoleo et al. ................ 326/87 |
| 5,877,647 * | 3/1999 | Vajapey et al. ................ 326/58 |
| 5,889,415 | 3/1999 | Parkinson . |

OTHER PUBLICATIONS

Thompson, et al.; "Dual Threshold Voltages and Substrate Bias: Keys to High Performance, Low Power, 0.1 um Logic Designs"; *1997 Symposium on VLSI Technology Digest of Technical Papers*; Jan. 1997; pp. 69–70.

Kawaguchi, et al.; "A CMOS Scheme for 0.5V Supply Voltage with Pico–Ampere Standby Current"; *IEEE International Solid–State Conference*; Paper FP 12.4; Jan. 1998; pp. 192–193.

Mutoh, et al.; "1–V Power Supply High–Speed Digital Circuit Technology with Multithreshold–Voltage CMOS"; *IEEE Journal of Solid State Circuits*; vol. 30 No. 8 Aug. 1995; pp. 847–854.

Halter, et al.; "A Gate–Level Leakage Power Reduction Method for Ultra–Low–Power CMOS Circuits"; *IEEE Custom Integrated Circuit Conference*; Aug. 1997; 4 pages.

Kuroda, et al.; "A 0.9–V, 150–MHz, 10–mW, 4 mm$_2$, 2–D Discrete Cosine Transform Core Processor with Variable Threshold–Voltage (VT) Scheme"; *IEEE Journal of Solid–State Circuits*, vol. 31, No. 11, Nov. 1996; pp. 1770–1779.

* cited by examiner

Primary Examiner—Michael Tokar
Assistant Examiner—Don Phu Le
(74) Attorney, Agent, or Firm—Cynthia T. Faatz

(57) ABSTRACT

A technique for reducing standby leakage current in a circuit block using input vector activation. A complex circuit includes a plurality of inputs and one or more transistor stacks. At least some of the transistor stacks are coupled to at least one of the inputs. The circuit also includes logic to apply a selected input vector to the plurality of inputs during a standby mode. The input vector is selected based on a configuration of the one or more transistor stacks in the circuit block to turn off a first number of transistors in the transistor stacks. The first number is within a selected percent of a maximum number of transistors in the transistor stacks that can be turned off by any vector applied at the plurality of inputs.

19 Claims, 6 Drawing Sheets

METHOD AND APPARATUS FOR REDUCING STANDBY LEAKAGE CURRENT USING INPUT VECTOR ACTIVATION

RELATED APPLICATIONS

This application is related to copending application Ser. No. 09/151,177 entitled "A Method and Apparatus for Reducing Standby Leakage Current Using A Transistor Stack Effect," filed Sep. 10, 1998, and assigned to the assignee of the present application.

FIELD

An embodiment of the present invention relates to integrated circuits and, more particularly, to a method and apparatus for reducing standby leakage current using selected input vectors.

BACKGROUND

With the scaling of semiconductor process technologies, threshold voltages of metal oxide semiconductor circuits are typically being reduced with reductions in supply voltages in order to maintain circuit performance. Lower transistor threshold voltages lead to significant increases in leakage current due to the exponential nature of sub-threshold conductance. Higher leakage currents increase power dissipation which is undesirable for many semiconductor circuit applications. Higher leakage currents can be particularly problematic for mobile and handheld applications, for example.

One approach to addressing this issue has been to use dual threshold voltage and/or substrate bias techniques. In a dual threshold voltage approach, certain devices on a particular integrated circuit are designed and fabricated to have a first, low threshold voltage, while other devices on the same integrated circuit are designed and fabricated to have a second, higher threshold voltage. In this manner, devices that cannot tolerate the higher leakage current characteristic of lower threshold voltages can be selected to have higher threshold voltages.

In order to implement a dual threshold voltage scheme, additional gates are added to provide a transition from low threshold voltage areas to higher threshold voltage areas. The additional gates take up valuable semiconductor real estate. Further, circuit performance and power dissipation can be compromised using this approach.

Where a substrate bias technique is used, during an active mode, a control circuit applies a voltage to transistor bodies to zero- or reverse-bias the bodies with respect to the transistors. Upon entering a standby mode, the control circuit changes the substrate bias voltage to cause a reverse bias or deepen an existing reverse bias in the transistor bodies. In this manner, the threshold voltage of the transistors are increased during a standby mode to reduce or cut off leakage current.

A disadvantage of this approach is that a large change in body bias is required to change the transistor threshold voltages by even a small amount. Further, when changing from active mode to standby mode and vice versa, large capacitances in transistor wells are switched from one voltage to another. Thus, significant power is dissipated during each mode transition. An increase in design complexity may also result from implementing such a substrate bias technique.

In a paper presented at the IEEE Custom, Integrated Circuit Conference in August of 1997 entitled, "A Gate-Level Leakage Power Reduction Method for Ultra-Low-Power CMOS Circuits," by Jonathan P. Halter and Farid N. Najm of the ECE Dept. and Coordinated Science Lab. at the University of Illinois at Urbana-Champaign ("the Halter reference"), another approach to reducing leakage power is proposed. The Halter reference describes an approach wherein, for a multi-gate logic circuit, an algorithmically determined input vector is applied to the multi-gate logic circuit during an idle period to reduce leakage power of the multi-gate logic circuit during the idle period.

The algorithm described in the Halter reference for determining the input vector to be applied to the multi-gate logic depends on being able to estimate the leakage associated with a candidate vector. As described in the Halter reference, this can be done using a circuit-level simulator or by building library models for logic gates that give the leakage current drawn by a gate for each of its input combinations.

As admitted by Halter, the search problem for the vector that gives the least leakage power is a very difficult one because of the potentially huge size of the search space. With this in mind, Halter looks not for a vector that minimizes leakage current, but rather only for a vector that gives a significantly lower value of leakage and which can be found efficiently using a described algorithm.

The algorithm described in the Halter reference for selecting such an input vector is based on a process of random sampling. Randomly chosen vectors are applied to the circuit, the leakage due to each is monitored and the vector that gives the least observed leakage out of those selected is used. Thus, according to Halter, the quality of the solution in terms of the particular input vector selected is related to the number of randomly chosen vectors that are tested.

An issue with the approach described in the Halter reference is that potential input vectors are randomly chosen to find one that reduces leakage. The only way to know whether a chosen vector is good or bad is to choose and test many other vectors. For complex circuits including hundreds or thousands of gates, this task can require significant time. Further, there is virtually no way to know whether another input vector that has not been tested might provide leakage reduction superior to the chosen vector. The chance of choosing the input vector that provides the maximum leakage reduction possible for a given circuit using the approach described in Halter is very small, particularly for large circuits having many inputs.

SUMMARY OF THE INVENTION

A method and apparatus for reducing standby leakage current in CMOS circuits using selected input vectors is described. For one embodiment, a complex circuit comprises a plurality of inputs and one or more transistor stacks, at least some of the transistor stacks being coupled to at least one of the inputs. The complex circuit block further comprises logic to apply a selected input vector to the plurality of inputs during a standby mode, the input vector being selected based on a configuration of the one or more transistor stacks in the circuit block, the input vector being selected to turn off a first number of transistors in the transistor stacks, the first number being within a selected percent of a maximum number of transistors in the transistor stacks that can be turned off by any vector applied at the plurality of inputs.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for reducing standby leakage current in a circuit block by activating a selected input vector are described. In the description that follows, particular types of circuits are described for purposes of illustration. It will be appreciated, however, that other embodiments are applicable to other types of circuits.

For one embodiment, a circuit block is analyzed to identify one or more transistor stacks. A transistor stack, as the term is used herein, refers to two or more transistors of a same type (i.e. n-type or p-type) coupled in series. Based on a configuration of the circuit block, an input vector is selected to be applied to inputs of the circuit block during a standby mode. The selected input vector turns off a first number of transistors in the identified transistor stack(s). For one embodiment, the first number of transistors is within five percent of a maximum number of transistors that can be turned off through the inputs of the circuit block. Application of the selected input vector during the standby mode reduces leakage current in the circuit block during the standby mode.

Figure 1:
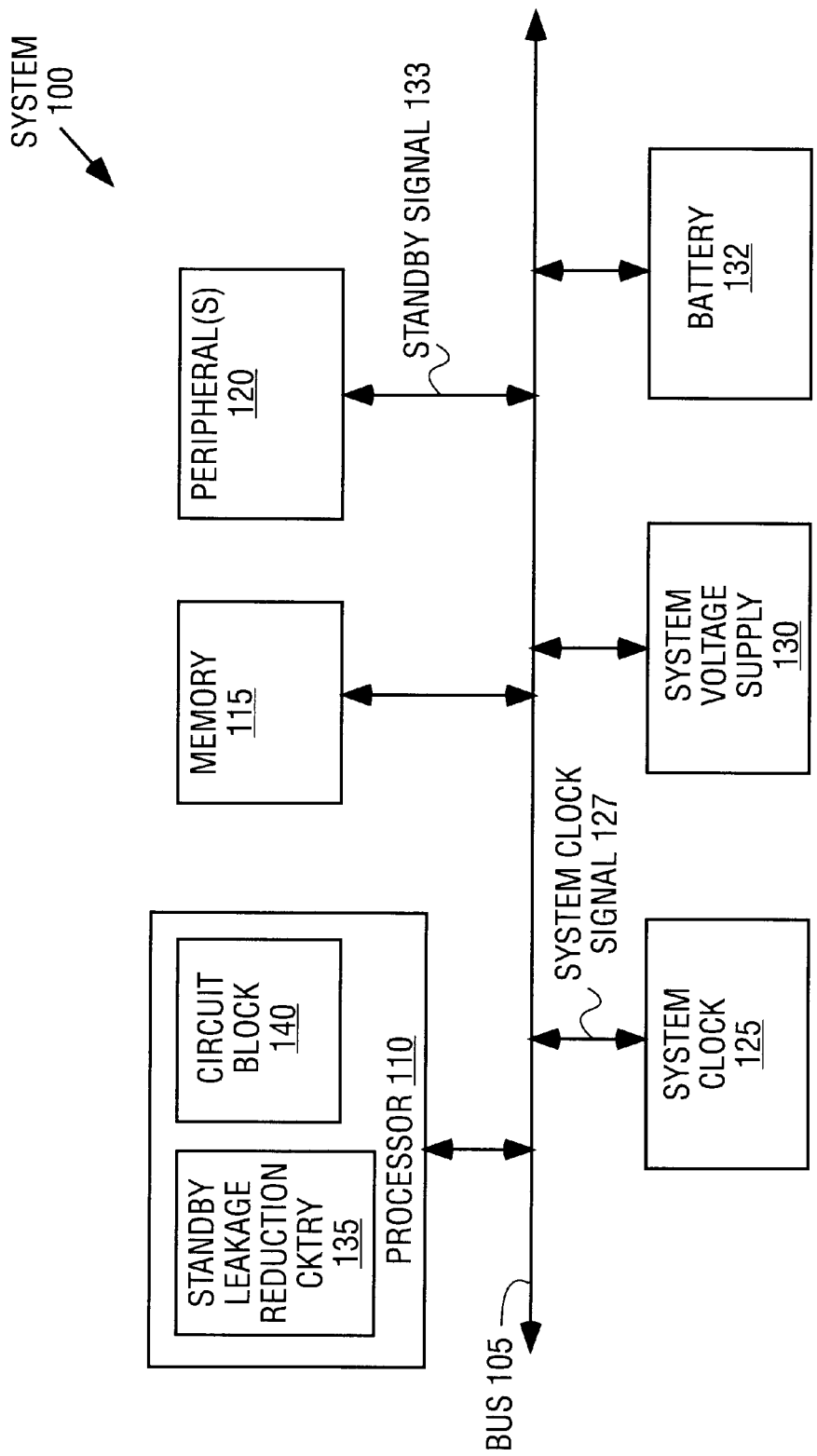
FIG. 1 is a block diagram of a computer system in which one embodiment of the standby leakage reduction circuitry may be used.

FIG. 1 is a block diagram showing an example of a mobile computer system 100 (e.g. laptop, notebook or handheld computer) in which standby leakage reduction circuitry of one embodiment may be implemented. The computer system 100 includes a bus 105 for communicating information among various components of the computer system 100. A processor 110 for processing instructions, one or more memories 115 to store instructions and information for use by the processor 110, one or more peripheral devices 120, a system clock 125, a system voltage supply 130 and a battery 132 are coupled to the bus 105 for one embodiment.

The system clock 125 provides a system clock signal 127 to one or more of the components of the computer system 100. Thee system voltage Supply 130 provides a system operating voltage for the computer system 100. The peripheral(s) 120 may provide a system standby signal 133 to cause the system 100 to enter a lower power mode in response to particular events.

For one embodiment, the processor 110 includes standby leakage reduction circuitry 135 to reduce leakage current of a circuit block 140 on the processor 110 during a standby mode of the circuit block 140. A circuit block, as the term is used herein, refers to interconnected circuitry having a set of inputs and a set of outputs. A circuit block may be in the form of a functional unit block (FUB), for example, and may be located between latch boundaries.

It will be appreciated that, for other embodiments, the standby leakage reduction circuitry and a corresponding circuit block may be provided on other types of integrated circuit devices including, for example, chipsets and other peripheral chips.

It will also be appreciated that systems other than mobile or handheld computer systems, or computer systems configured in another manner than the computer system 100 of FIG. 1, may also be used with various embodiments.

Figure 2:
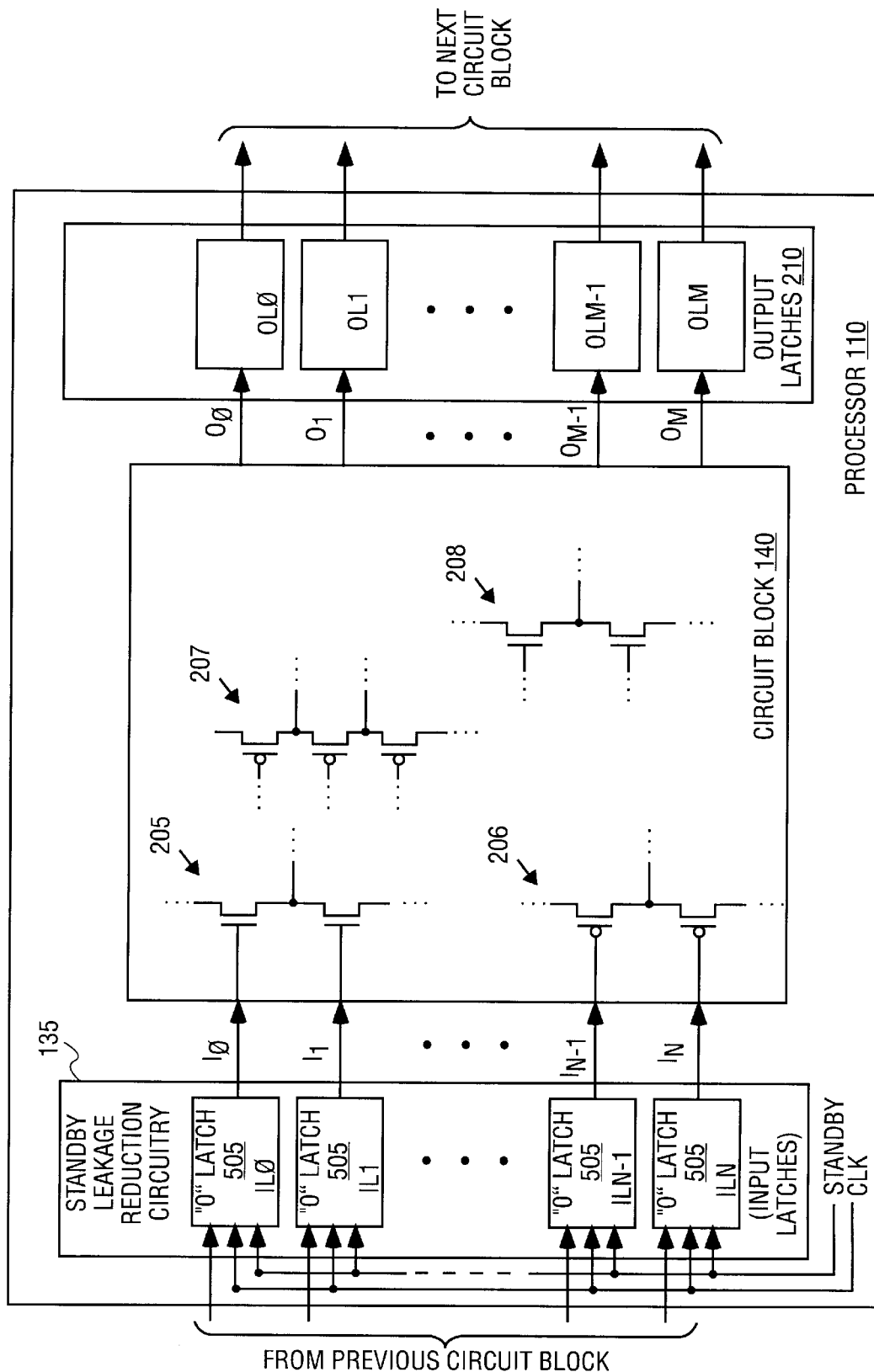
FIG. 2 is diagram showing one embodiment of the circuit block and standby leakage reduction circuitry of FIG. 1 in more detail.

FIG. 2 is a block diagram showing one embodiment of the standby leakage reduction circuitry 135 and circuit block 140 in more detail. The circuit block 140 comprises various gates configured to perform one or more specific functions. The circuit block 140 of one embodiment is a complex circuit block that includes hundreds of transistors. For one embodiment, the circuit block 140 includes 1000 or more transistors and is a functional unit block (FUB) such as an adder, for example. For other embodiments, different types of circuit blocks including a different number of transistors may be used.

Within the circuit block 140, a number of transistor stacks 205–208 are included at various locations. For one embodiment, the transistors in the circuit block 140 are field effect transistors (FETs) which are either n-type or p-type (also referred to herein as nFETs or pFETs, respectively). Thus, for one embodiment, a transistor stack includes two or more nFETs coupled in series or two or more pFETs coupled in series. In the examples discussed below, the FETs are metal oxide semiconductor FETs (MOSFETs), but other types of FETs may be used for other embodiments.

The gates of many of the transistors in the transistor stacks 205–208 are either directly or indirectly coupled to one or more inputs $I_0-I_N$ of the circuit block 140 (where N may be any integer). In this manner, voltages on such gates can be directly or indirectly controlled by logical values applied at the inputs $i_0-I_N$.

For one embodiment, logical values are applied at the inputs $i_0-I_N$ of the circuit block 140 using input latches $IL_0-IL_N$, respectively, which are included in the standby leakage reduction circuitry 135 for one embodiment. The input latches $IL_0-IL_N$ operate to latch incoming data directed to the circuit block 140 from one or more preceding circuit blocks and/or other logic (not shown). The input latches $IL_0-IL_N$ subsequently provide the latched data, or an inverse of the latched data, to the corresponding inputs of the circuit block 140.

Each of the input latches $IL_0-IL_N$ are also coupled to receive a clock signal CLK. The CLK signal is used to synchronize the latches $IL_0-IL_N$ in a well-known manner such that an input vector latched by the latches $IL_0-IL_N$ is applied concurrently to the corresponding inputs $I_0-I_N$. The CLK signal may be the system clock signal 127 from the system clock 1225 (FIG. 1), or an internal or local clock signal, for example.

For one embodiment, in addition to receiving the CLK signal and data from preceding logic, the input latches $IL_0-IL_N$ are coupled to receive a STANDBY signal. The STANDBY signal may be a system standby signal such as the system standby signal 133 (FIG. 1), a local standby signal or any type of signal that puts the circuit block 140 into a lower power state.

For one embodiment, the STANDBY signal is a clock gating signal used to selectively prevent specific circuitry in the circuit block 140 from being clocked. In this manner, the STANDBY signal is used to reduce power dissipation of the circuit block 140 and/or other circuitry at particular times. For one embodiment, when the STANDBY signal is not asserted, the circuit block 140 is in an active mode.

For an alternative embodiment, an ACTIVE signal or any type of signal that puts the circuit block 140 into an active mode may be used in place of a STANDBY signal such that a low power mode is entered when the ACTIVE signal is deasserted. Whatever signal is used, it is desirable during such a lower power mode to have the power dissipation of the circuit block 140 as low as possible.

As discussed above, with reductions in transistor threshold voltages, leakage current during a standby, idle or another type of low power mode can become an increasingly large part of overall circuit power dissipation. Various embodiments of the present invention take advantage of the fact that, for transistor stacks, the more transistors that are turned off, the greater the leakage reduction. This effect is described in more detail with reference to FIG. 3.

Figure 3:
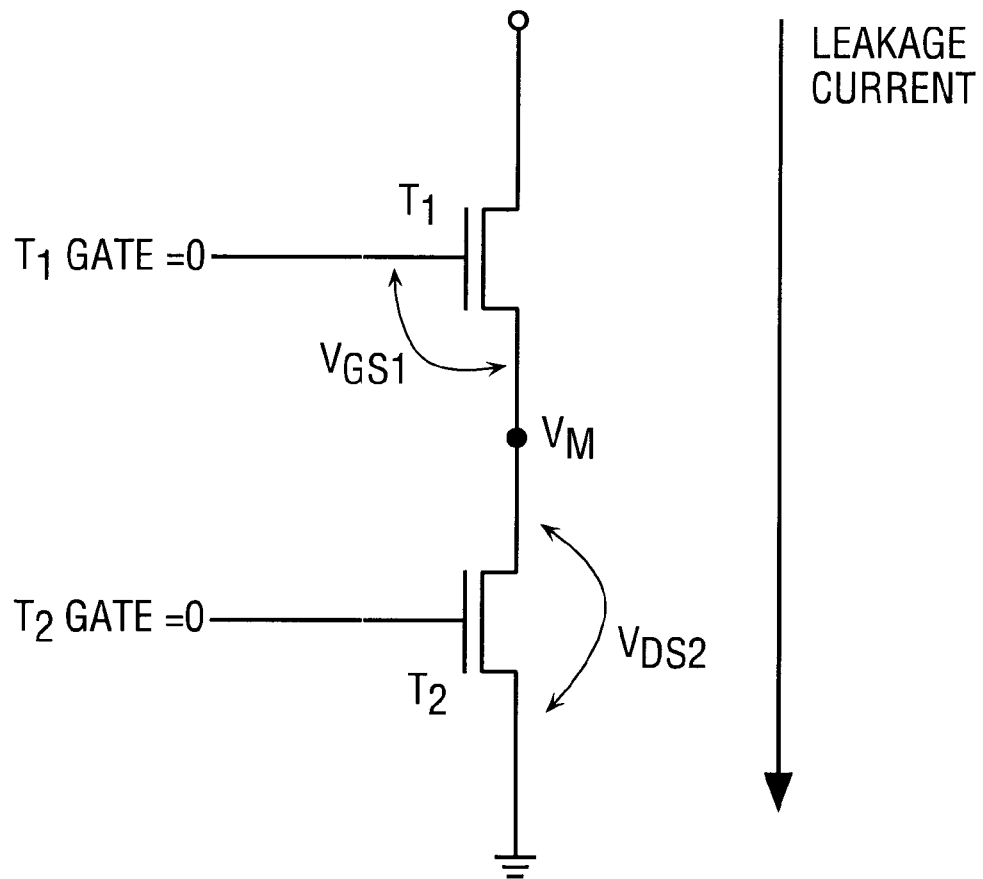
FIG. 3 is a schematic representation of a transistor stack.

FIG. 3 shows a schematic diagram of a transistor stack 300 including two series-coupled n-type devices $T_1$ and $T_2$. When both $T_1$ and $T_2$ are turned off (i.e. when the voltage at both of their gates is a logical 0), the gate to source voltage ($V_{GS1}$) of $T_1$ is less than 0. Additionally, the bodies of the transistors $T_1$ and $T_2$ are tied to ground or another voltage. When both $T_1$ and $T_2$ are turned off, the threshold voltage of $T_1$ is increased due to the body effect. Turning $T_1$ and $T_2$ off also reduces the drain to source voltage $V_{DS2}$ of $T_2$ causing the threshold voltage of $T_2$ to increase as the voltage at the intermediate node Vm converges to a very small value.

The above effects alone and/or in combination cause the leakage current through the transistor stack 300 to be approximately an order of magnitude smaller when both $T_1$ and $T_2$ are turned off as compared to when only one of $T_1$ or $T_2$ is turned off. For transistor stacks including more than two transistors of a same type coupled in series, an even larger reduction in leakage current is possible where three or more stacked transistors are turned off at once. The stack effect has similar advantages for two or more p-type transistors coupled in series.

Other than inverters, most common logic gates include stacked transistors in p-type trees, n-type trees or both. For example, NOR gates include stacked p-type transistors and NAND gates include stacked n-type transistors. Thus, circuit blocks typically contain a large percentage of logic gates in which transistor stacks are present.

Referring back to FIG. 2, the leakage current of the circuit block 140 can therefore be reduced during a standby mode, or at other times the circuit block 140 is idle, by selecting an input vector that causes more than one transistor in stacks in the circuit block 140, such as the stacks 205–208, to be turned off. The selected input vector is applied at the inputs $I_0$–$I_N$ at the times it is desirable to reduce the circuit block 140 leakage current. An input vector, as the term is used herein, refers to a string of logical 1s and/or 0s corresponding to a set of circuit block inputs, wherein the string 1s and/or 0s is applied in parallel to the corresponding inputs.

Figure 4:
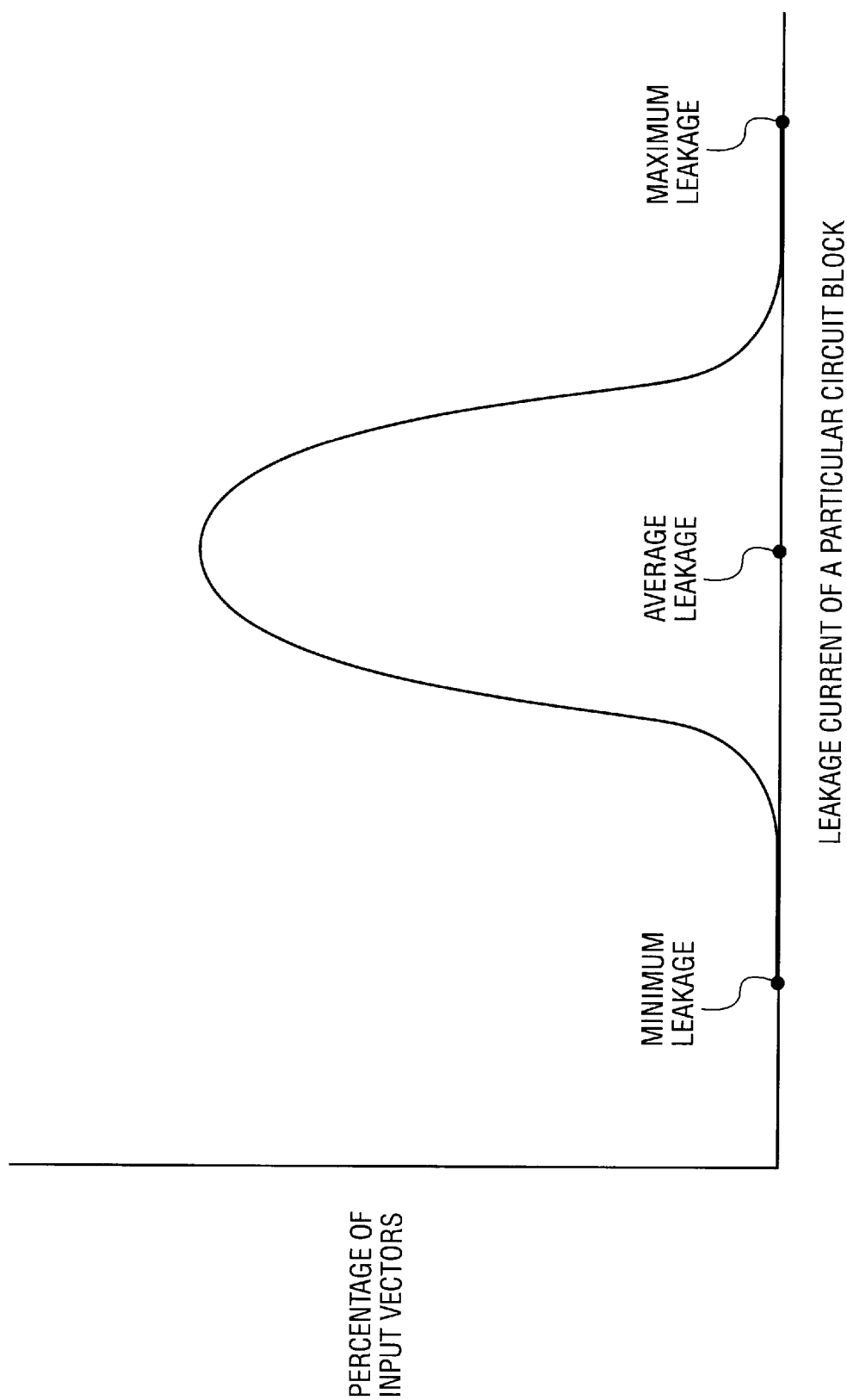
FIG. 4 is a graphical representation showing leakage current of a particular circuit block versus a percentage of input vectors.

FIG. 4 is a graph showing the leakage current for a circuit block, such as the circuit block 140, versus the percentage of possible input vectors that may be applied at the inputs of the circuit block. As shown in FIG. 4, a large percentage of the possible input vectors that may be applied at the inputs of a given circuit block will provide leakage current in the average range. Only a very small percentage of the possible input vectors for the given circuit block will come close to the minimum possible leakage current for the circuit block.

For a typical functional unit block or other complex circuit block, for example, the number of possible input vectors has the potential to be extremely large. With that in mind, it is important to be able to select an input vector that will provide close to the minimum leakage current for each circuit block for which leakage current is to be reduced. In accordance with one embodiment, by evaluating the configuration of a circuit block to identify the transistor stacks, selection of an appropriate input vector is greatly simplified.

Referring back to FIG. 2, for example, in order to select an input vector to be applied to the circuit block 140 during a standby mode, the circuit block 140 is analyzed to identify transistor stacks including the transistor stacks 205–208. An input vector to be applied at the inputs $I_0$–$I_N$ is then selected based on the circuit block configuration.

The transistor stack 205, for example, is an n-type stack having a gate of a first transistor coupled to the input $I_0$ and a gate of a second transistor coupled to the input $I_1$. Both transistors in the stack 205 will be turned off if a voltage equivalent to a logical 0 is applied at both $I_0$ and $I_1$. In a similar manner, both transistors of the p-type stack 206 will be turned off if a voltage equivalent to a logical 1 is applied at both $I_{N-1}$ and $I_N$.

Transistor stacks such as the transistor stacks 207 and 208 are indirectly coupled to one or more of the inputs $I_0$–$I_N$. Where the configuration of the circuit block 140 is regular, such as is typical for datapath functional unit blocks (adders, multipliers, comparators, etc.), for example, it is relatively straightforward to determine an input vector that turns off a maximum possible or close to maximum possible number of transistors in stacks, including stacks that are indirectly coupled to the circuit block 140 inputs.

Examination of the circuit block 140 structure to identify a desirable input vector may be performed visually using circuit block 140 schematics. Alternatively, the circuit block 140 structure may be examined to identify transistor stacks and a desirable input vector using a computer system, specialized software stored on a data storage media and executed by a computer system, or another type of tool. Either way, an input vector that will reduce the circuit block 140 leakage current during a standby mode to close to a minimum achievable level for the particular circuit block structure (as shown in FIG. 4) can be identified in a relatively short amount of time.

Where analysis of a circuit block in the above manner produces a range of possible input vectors, the range of possible input vectors can be tested and the input vector that provides the largest increase in leakage reduction may be used. This approach uses a combination of circuit analysis to identity transistor stacks and some testing and/or simulation. This approach may be used, for example, for less regular circuit blocks. Other approaches that take into consideration the identification of transistor stacks in a circuit block to efficiently identify an input vector to be applied during a standby mode to reduce leakage current are also within the scope of various embodiments.

It will be appreciated that, depending on the circuit block configuration an given number of inputs, it may not be possible to turn off all transistors in stacks with any input vector. A goal of some embodiments is to come as close as possible to turning off a maximum number of transistors in stacks that can be turned off for a given circuit configuration and number of inputs.

For one embodiment, using one of the above approaches, an input vector can be selected that turns off within five percent of the maximum number of transistors in stacks that can be turned off for a particular circuit configuration and number of inputs. For example, if a given circuit block includes 800 transistors that are included in various stacks and the best input vector that can be applied to the inputs of the circuit block (the one that turns off the most possible transistors in stacks) turns off 700 of those 800 transistors, the described embodiment would enable one to efficiently select an input vector that turns off within 5% of that maximum, or 665 or more of the 800 transistors in stacks. For other embodiments, a goal for the percentage of transistors in stacks to be turned off out of those that can be turned off may be different than 5%.

Using the approaches described above, it is possible to come very close to the minimum leakage possible for a given circuit block. Using the random testing approach described in the Halter reference (Background), it is very difficult to nearly impossible to select an input vector that reduces leakage in a complex circuit block to such a level.

With continuing reference to FIG. 2, once a desirable input vector is identified, the standby leakage reduction circuitry is appropriately configured to provide the desired input vector at the desired times. For one embodiment, the input latches $IL_0$–$IL_N$ are configured to "store" the identified input vector and to provide the input vector to the corresponding inputs $I_0$–$I_N$ when the STANDBY signal is asserted. Static latches such as those shown in FIGS. 5 and 6 are used to apply the selected input vector for one embodiment.

Figure 5:
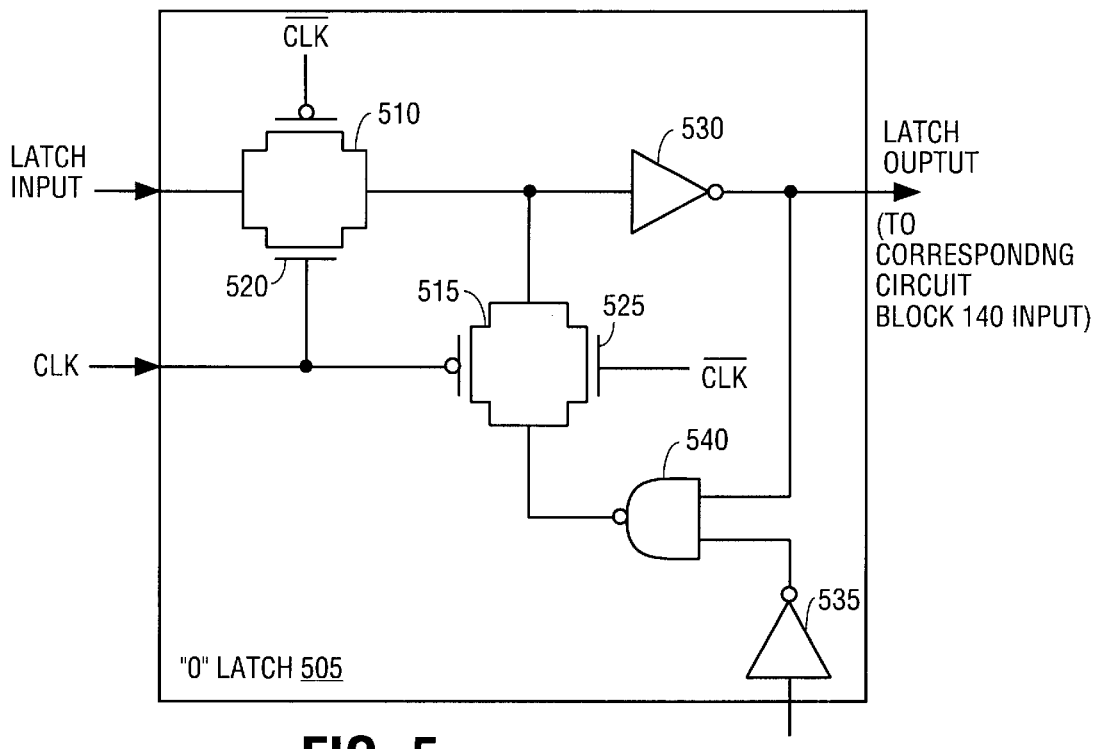
FIG. 5 is a schematic representation of one embodiment of a latch that may be used to provide a logical "0" at an input of the circuit block of FIG. 2 during a standby mode.
Figure 6:
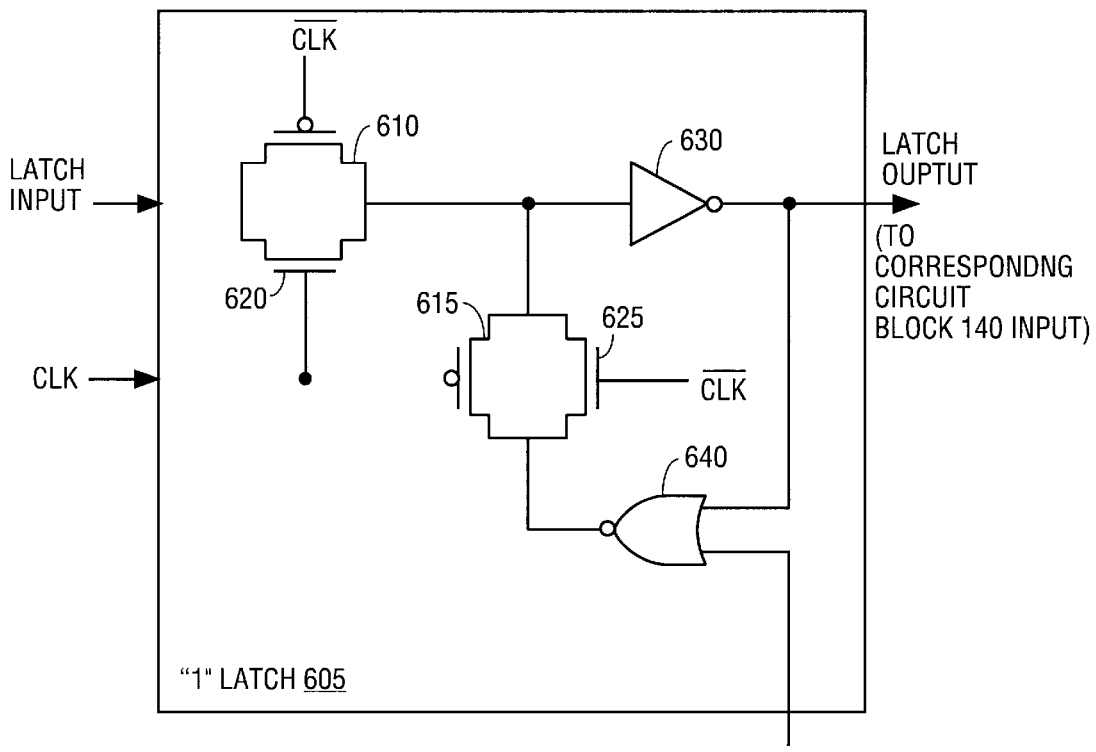
FIG. 6 is a schematic representation of one embodiment of a latch that may be used to provide a logical "1" at an input of the circuit block of FIG. 2 during a standby mode.

FIG. 5 shows one embodiment of a "0" latch 505 that may be used to store and apply a logical 0 to a corresponding input. The "0" latch 505 includes p-type transistors 510 and 515, n-type transistors 520 and 525, inverters 530 and 535 and a NAND gate 540 which are coupled in the manner shown in FIG. 5.

In operation, when the STANDBY signal is not asserted, a logical value at the latch 505 input from preceding logic is passed through to the input of the inverter 530, inverted and provided at the latch 505 output. In this manner, when the STANDBY signal is not asserted, the latch 505 output follows the inverse of the latch 505 input.

When the STANDBY signal is asserted, however, the output of the NAND gate 540 is a logical 1 which is provided at the input of the inverter 530 to force a logical 0 at the latch 505 output. Thus, when the STANDBY signal is asserted, a logical 0 is generated in the feedback loop formed by the NAND gate 540, the transistors 515 and 525 and the inverter 530 and forced at the "0" latch 505 output regardless of the value at the latch 505 input.

Similarly, the "1" latch 605 of FIG. 6 includes p-type transistors 610 and 615, n-type transistors 620 and 625, an inverter 630 and a NOR gate 640 coupled in the manner shown in FIG. 6. When the STANDBY signal is not asserted, the logical value at the latch 605 input is received at the inverter 630 input, inverted and provided at the latch 605 output.

When the STANDBY signal is asserted, the output of the NOR gate 640 transitions to a logical 0 value which is provided at the inverter 630 input. Accordingly, a logical 1 is forced at the latch 605 output when the STANDBY signal is asserted regardless of the logical value at the latch 605 input.

The latches 505 and 605 of FIGS. 5 and 6, respectively, include only a few additional transistor gates as compared to a standard static latch that simply receives input data from a preceding stage and provides the data (or its inverse) to the circuit block. For example, one prior static latch is configured in the same manner as the latch 605 except that an inverter is used in place of the NOR gate 640. Further, in comparison to prior standard static latches, there is little to no performance penalty for using the latches 505 and 605 to provide the above-described functionality because the "stored" portions of the predetermined input vector are provided in the feedback loops of the respective latches. In this manner, the path for data from preceding logic to the inputs $I_0$–$I_N$ is not changed at all.

Referring back to FIG. 2, for one embodiment, where the selected input vector includes logical 0s to be applied to $I_0$ and $I_1$, and logical 1s to be applied to $I_{N-1}$ and $I_N$, the input latches $IL_0$ and $IL_1$ are configured as "0" latches 505 and input latches $IL_{N-1}$ and $IL_N$ are configured as "1" latches 605 as shown in FIG. 2.

The input latches $IL_0$–$IL_N$ of this embodiment each operate in the manner described with reference to FIGS. 5 or 6 to provide the desired input vector when the STANDBY signal is asserted. When the STANDBY signal is deasserted to indicate the end of a low power mode, the input latches $IL_0$–$IL_N$ return to operation as a standard static latch to provide the inverse of the next value applied at their inputs from the preceding logic to the circuit block. 140.

For some embodiments, output latches 210, including output latches $OL_0$–$OL_M$ (where M may be any integer) corresponding to circuit block 140 outputs $O_0$–$O_M$, respectively, may also be provided. Output latches 210 latch data available at the corresponding outputs $O_0$–$O_m$ of the circuit block 140 for use by succeeding logic (not shown). It will be appreciated that output latches 210 may function as input latches for another circuit block (not shown) of the processor 110. Where output latches 210 are also used as input latches for a succeeding circuit block, output latches 210 may be configured in a similar manner to input latches $IL_0$–$IL_N$ using an input vector selected for the succeeding circuit block in the manner described above.

It will be appreciated that, for other embodiments, the "0" and "1" latches described above may be configured in a different manner than that shown in FIGS. 5 and 6, respectively. Further, for other embodiments, a selected input vector for a particular circuit block may be stored in a memory and applied during a standby or low power mode through input latches to the particular circuit block. Also, for still other embodiments, a selected input vector may be applied to a particular circuit block through software, registers or in another manner.

The standby leakage reduction method and apparatus of various embodiments reduces leakage current in circuit blocks with minimal overhead in terms of additional area and power consumption. Further, no process changes are required to implement the embodiments described above. There is also no impact to the manner in which circuit blocks are designed other than 1) determining at design time what the desired input vector for a given circuit block will be and 2) integrating the appropriate latch or means for providing the selected vector during a standby mode. Using the above-described approaches, it may be possible to alleviate the need to design devices with higher threshold voltages to provide leakage reduction in current and future low process technologies.

Figure 7:
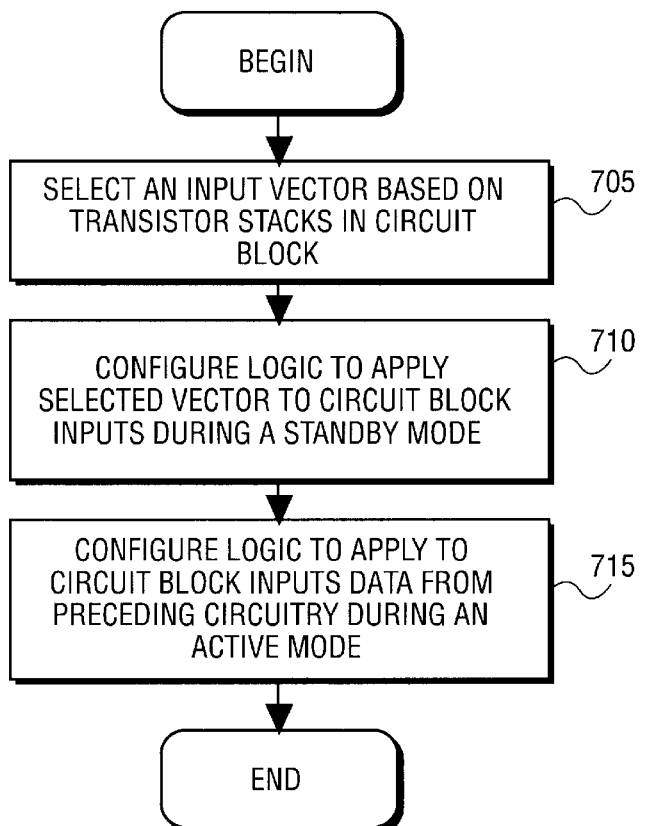
FIG. 7 is a flow diagram showing a method of one embodiment for designing standby leakage current reduction circuitry.

FIG. 7 is a flow diagram showing the method of one embodiment for designing standby leakage current reduction circuitry. In step 705, an input vector for a complex circuit block is selected based on the configuration of transistor stacks in the circuit block in the manner described above. The input vector is selected such that, when the input vector is applied to the circuit block inputs, a number of transistors in stacks is turned off that is within a selected percentage of a maximum number of transistors in stacks that can be turned off with any input vector given the configuration of the circuit block and its inputs. Once an input vector has been selected, in step 710, logic is configured to apply the selected input vector to inputs of the circuit block during a standby mode or when the circuit block otherwise enters a lower power mode. In step 715, the logic is further configured to apply data or an inverse of data from preceding logic to the inputs of the circuit block during an active mode of the circuit block.

Figure 8:
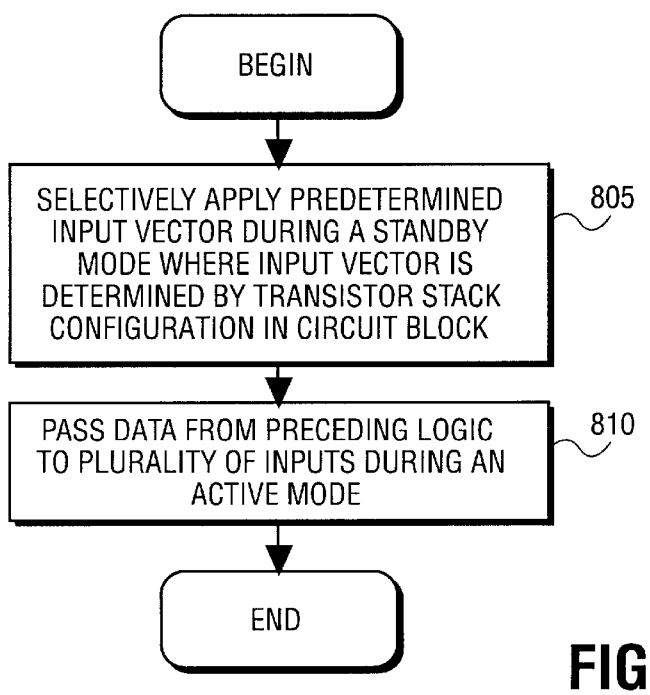
FIG. 8 is a flow diagram showing a method of one embodiment for reducing leakage current of a circuit block during a standby mode.

FIG. 8 is a block diagram showing a method of one embodiment for reducing standby leakage current of a circuit block during a standby mode. In step 805, a predetermined input vector is selectively applied to the inputs of a circuit block during a standby mode. The predetermined input vector in this case is determined by the configuration of transistor stacks such that the predetermined input vector turns off a number of transistors in stacks that is within a selected percent of a maximum number of transistors in stacks that can be turned off by any vector given the configuration of the circuit block and its inputs. In step 810, data is passed from preceding logic to the circuit block inputs during an active mode. For one embodiment, the data may be inverted before it is passed to the circuit block inputs.

It will be appreciated that the methods of other embodiments may include fewer or more steps than those described above.

In the foregoing specification, the invention has been described with reference to specific exemplary embodiments thereof. It will, however be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A complex circuit comprising:
    at least one hundred transistors;
    a plurality of inputs;
    one or more transistor stacks included within the at least one hundred transistors, the one or more transistor stacks each including two or more transistors of a same type coupled in series, at least some of the transistor stacks being coupled to at least one of the inputs; and
    logic to apply a selected input vector to the plurality of inputs during a standby mode, the input vector being selected based on a configuration of the one or more transistor stacks in the complex circuit block, the input vector being selected to turn off a first number of transistors in the transistor stacks, the first number being within a selected percent of a maximum number of transistors in the transistor stacks that can be turned off by any vector applied at the plurality of inputs.

2. The circuit of claim 1 wherein the one or more transistor stacks include field effect transistor (FET) stacks.

3. The circuit of claim 1 wherein the logic includes a plurality of latches, the plurality of latches including a latch corresponding to each of the plurality of inputs, the plurality of latches being configured to apply the selected input vector to the plurality of inputs during the standby mode.

4. The circuit of claim 3 wherein, during an active mode, the plurality of latches are further configured to apply input data from preceding logic to the plurality of inputs.

5. The circuit of claim 3 wherein each of the plurality of latches is configured as either a logical 0 latch or a logical 1 latch, the logical 0 latch being configured to force a logical 0 at the corresponding input during the standby mode, the logical 1 latch being configured to force a logical 1 at the corresponding input during the standby mode, the logical 0 and logical 1 latches both configured to provide an inverse of data received from preceding logic to the corresponding input during an active mode.

6. The circuit of claim 3 wherein the standby mode is indicated by a standby signal and wherein the plurality of latches are responsive to the standby signal to apply the selected input vector.

7. The circuit of claim 4 wherein the active mode is indicated by a complement of a standby signal and wherein the plurality of latches are responsive to the complement of the standby signal to apply the inverse of data from preceding logic to the plurality of inputs.

8. A method comprising:
    selecting an input vector to be applied to a plurality of inputs to a complex circuit block during a standby mode, the complex circuit block comprising at least one hundred transistors, the input vector being selected based on the configuration of the complex circuit block, the input vector being selected to cause a number of transistors of a same type in stacks to be turned off, the number being within a selected percent of a maximum number of transistors of the same type in stacks that can be turned off by any vector applied at the plurality of inputs; and
    providing logic to apply the input vector to the plurality of inputs during a standby mode of the complex circuit block.

9. The method of claim 8 further including configuring the logic to apply data from preceding circuitry to the plurality of inputs during an active mode of the circuit block.

10. The method of claim 8 wherein configuring logic includes configuring latches to apply the input vector to the plurality of inputs during a standby mode of the complex circuit block.

11. A method comprising:
    selectively applying a predetermined input vector to plurality of inputs to a complex circuit block during a standby mode, the complex circuit block comprising at least one hundred transistors, the input vector being determined by a structure of the complex circuit block, the input vector being selected such that application of the input vector causes a first number of transistors of a same type in stacks in the complex circuit block to be turned off, the first number being within a selected percent of the maximum number of transistors of the same type in stacks that can be turned off in the complex circuit block with any vector applied at the plurality of inputs.

12. The method of claim 11 further including passing data from preceding logic to the plurality of inputs during an active mode of the complex circuit block.

13. A mobile computer system comprising:
    a bus to communicate information;
    a battery coupled to the bus;
    a memory coupled to the bus to store instructions;
    logic coupled to the bus to generate a standby signal; and
    a processor coupled to the bus to process the instructions, the processor including
        a complex circuit block including at least one hundred transistors, a plurality of inputs and at least one transistor stack including two or more transistors of a same type coupled in series; and standby leakage reduction circuitry coupled to the complex circuit block, the standby leakage reduction circuitry to apply a selected input vector to the plurality of inputs when the standby signal is asserted, the input vector being selected based on a configuration of the at least one transistor stack in the complex circuit block, the input vector being selected to turn off a first number of transistors in the at least one transistor stack, the first number being within a selected percentage of a maximum number of transistors in the at least one transistor stack that can be turned off by any vector applied at the plurality of inputs.

14. The mobile computer system of claim 13 wherein the standby leakage reduction circuitry is further to apply to the plurality of inputs an inverse of data from preceding logic when the standby signal is not asserted.

15. The mobile computer system of claim 13 wherein the standby leakage reduction circuitry comprises a plurality of latches corresponding to the plurality of inputs, each of the plurality of latches being either a 0 latch or a 1 latch, the 0 latch to force a logical 0 at the corresponding input when the standby signal is asserted, the 1 latch to force a logical 1 at the corresponding input when the standby signal is asserted.

16. The mobile computer system of claim 15 wherein the plurality of latches are further to latch data from preceding logic when the standby signal is not asserted and to apply an inverse of the latched data to the corresponding one of the plurality of inputs.

17. A method comprising:

analyzing a complex circuit block to identify transistor stacks that include two or more transistors of a same type coupled in series, the complex circuit block including at least one hundred transistors;

identifying an input vector that turns off a number of transistor in the transistor stacks, the number being within a selected percentage of a maximum number of transistors in the transistor stacks that can be turned off with any input vector.

18. The method of claim 17 further comprising:

storing the input vector to be applied to inputs of the complex circuit block during a low power mode.

19. The method of claim 17 wherein analyzing comprises:

analyzing the complex circuit block using a computer program.

* * * * *

UNITED STATES PATENT AND TRADEMARK OFFICE
CERTIFICATE OF CORRECTION

PATENT NO. : 6,191,606 B1
DATED : February 20, 2001
INVENTOR(S) : Ye et al.

It is certified that error appears in the above-identified patent and that said Letters Patent is hereby corrected as shown below:

Column 4,
Line 57, delete "1225" and replace -- 125 --.

Column 5,
Line 57, after "string" insert -- of --.

Column 6,
Line 51, delete "identity" and replace with -- identify --.
Line 59, delete "an" and replace with -- and --.

Signed and Sealed this

Thirtieth Day of April, 2002

*Attest:*

JAMES E. ROGAN
*Attesting Officer*     *Director of the United States Patent and Trademark Office*